United States Patent
Murray (10) Patent No.: US 8,125,250 B2
(45) Date of Patent: Feb. 28, 2012

(54) FREQUENCY DETECTION MECHANISM FOR A CLOCK GENERATION CIRCUIT

(75) Inventor: Daniel C. Murray, Morgan Hill, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 12/732,959

(22) Filed: Mar. 26, 2010

(65) Prior Publication Data
US 2011/0234287 A1    Sep. 29, 2011

(51) Int. Cl.
*H03D 13/00* (2006.01)
*G01R 23/02* (2006.01)

(52) U.S. Cl. .......... 327/40; 327/39; 327/43; 327/48; 327/299; 324/76.41; 324/76.47; 324/76.48

(58) Field of Classification Search .......... 327/39–43, 327/47–49, 299; 324/76.39, 76.41, 76.47, 324/76.48
See application file for complete search history.

(56) References Cited

U.S. PATENT DOCUMENTS

| | | | |
|---|---|---|---|
| 5,302,908 A | | 4/1994 | Tarusawa |
| 5,982,208 A | | 11/1999 | Kokubo |
| 6,320,469 B1 | * | 11/2001 | Friedberg et al. ............. 331/1 A |
| 6,784,716 B2 | | 8/2004 | Meguro |
| 6,879,195 B2 | * | 4/2005 | Green et al. ................... 327/147 |
| 7,154,305 B2 | * | 12/2006 | Driediger et al. ............... 327/47 |
| 7,250,803 B2 | * | 7/2007 | Kazuma ........................ 327/291 |
| 7,317,359 B2 | | 1/2008 | Scuteri |
| 7,786,763 B1 | * | 8/2010 | Bal et al. ......................... 327/43 |

* cited by examiner

*Primary Examiner* — Patrick O'Neill
(74) *Attorney, Agent, or Firm* — Lawrence J. Merkel; Meyertons, Hood, Kivlin, Kowert & Goetzel, P.C.; Stephen J. Curran (57) ABSTRACT

A frequency detection mechanism for a clock generation unit on an integrated circuit includes a clock generation unit and a detection unit. The clock generation unit may generate an output clock signal at a predetermined frequency that corresponds to a frequency multiple of a reference clock signal provided as an input to the clock generation unit. The detection unit may determine whether the output clock signal is at the predetermined frequency. As such, the detection unit includes a first counter that may generate a first count value based upon the reference clock signal and a second counter that may generate a second count value based upon the output clock signal. The detection unit also includes comparison logic that may perform a plurality of multiplication operations on the first and second count values and generate a final result that indicates whether the output clock signal is at the predetermined frequency.

20 Claims, 6 Drawing Sheets

FREQUENCY DETECTION MECHANISM FOR A CLOCK GENERATION CIRCUIT

BACKGROUND

1. Technical Field

This disclosure relates to frequency detection and, more particularly, to frequency detecting mechanisms for clock generation circuits.

2. Description of the Related Art

Many types of electronic systems use clock generation circuits to generate clock signals. Some clock generation circuits use a reference clock to generate higher or lower frequency clock signals. One such circuit is referred to as a phase locked loop (PLL) circuit. An analog PLL typically includes a feedback path. If the PLL is used as a frequency multiplier, the feedback path includes a divider. A reference clock is mixed with the feedback signal to feed a phase detector. The output of the phase detector may be low pass filtered and used as a reference voltage of a voltage controlled oscillator (VCO). The output of the VCO may be used as the PLL output. The PLL is designed to provide an output clock that is phase locked with the input reference clock.

There are many ways to measure the frequency of the output clock of a clock generation circuit such as a PLL. For example, an oscilloscope, or a frequency meter may be used. However, when the clock generation circuit is manufactured on an integrated circuit (IC), it may not be cost effective to directly measure the output clock signal during production testing of the IC for a variety of reasons. More particularly, in some cases, IC pins may not be available for that purpose, unless special test mode interfaces are used. This type of testing may significantly slow production testing. Alternatively, it may be more costly to purchase an automated tester to measure the frequency if the frequency is especially high.

SUMMARY

Various embodiments of a frequency detection mechanism for a clock generation circuit are disclosed. In one embodiment, an integrated circuit includes a clock generation unit such as a phase locked loop (PLL), for example, and a detection unit. The clock generation unit may be configured to generate an output clock signal at a predetermined frequency that corresponds to a frequency multiple of a reference clock signal provided as an input to the clock generation unit. The detection unit may be configured to determine whether the output clock signal is at the predetermined frequency. As such, the detection unit includes a first counter that may be configured to generate a first count value based upon the reference clock signal and a second counter that may be configured to generate a second count value based upon the output clock signal. The detection unit also includes comparison logic that may be configured to perform a plurality of multiplication operations on the first and second count values and to generate a final result that indicates whether the output clock signal is at the predetermined frequency.

In one specific implementation, the plurality of multiplication operations may include a first multiplication between a first multiplier and the first count value to generate a first intermediate result, a second multiplication between a second multiplier and the second count value to generate a second intermediate result, and a third multiplication between a third multiplier and the second intermediate result to generate a third intermediate result. The first, second, and third multi-pliers may correspond to first, second, and third divider values used in the clock generation unit.

Specific embodiments are shown by way of example in the drawings and will herein be described in detail. It should be understood, however, that the drawings and detailed description are not intended to limit the claims to the particular embodiments disclosed, even where only a single embodiment is described with respect to a particular feature. On the contrary, the intention is to cover all modifications, equivalents and alternatives that would be apparent to a person skilled in the art having the benefit of this disclosure. Examples of features provided in the disclosure are intended to be illustrative rather than restrictive unless stated otherwise.

As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph six, interpretation for that unit/circuit/component.

DETAILED DESCRIPTION

Figure 1:
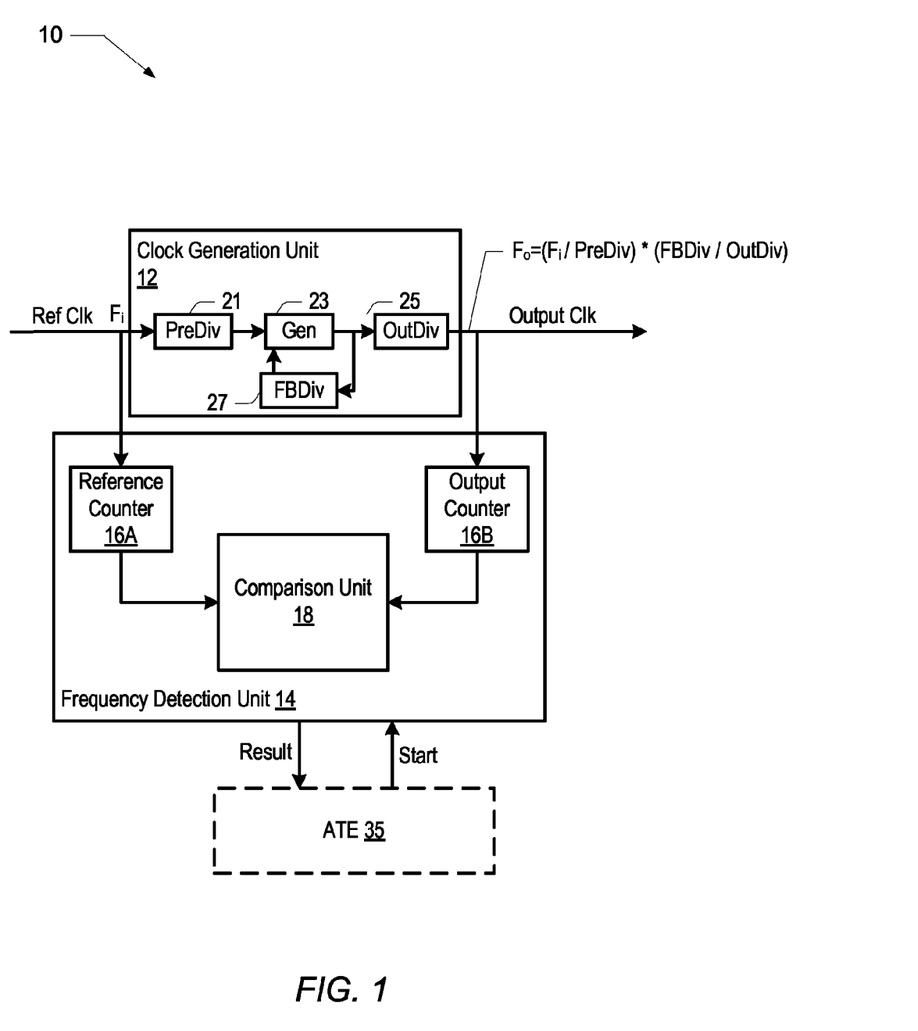
FIG. 1 is a block diagram of one embodiment of an integrated circuit including a frequency detection unit.

Turning now to FIG. 1, a block diagram of one embodiment of an integrated circuit including a frequency detection unit is shown. The integrated circuit 10 includes a clock generation circuit 12 coupled to a frequency detection unit 14. The clock generation unit 12 is coupled to receive a reference clock signal designated as Ref Clk, and to provide the output clock signal designated as Output Clk. The frequency detection unit 14 is coupled to receive a start signal and to provide a result. It is noted that components having a reference designator that includes a number and a letter may be referenced by the number alone, where appropriate.

In the illustrated embodiment, the clock generation unit 12 includes a PreDiv unit 21 that is coupled to a Gen unit 23, which is coupled to an OutDiv unit 25 and to the FBDiv unit 27. The FBDiv unit 27 is coupled back to the Gen unit 23 in a feedback loop. The OutDiv unit 25 is configured to provide the Output Clk signal. The PreDiv unit 21, the OutDiv unit 25 and the FBDiv unit 27 may be representative of divider units. In one embodiment, the dividers may be programmable dividers, and may be programmed through one or more storages or registers. In such an embodiment, the programmed divider values may be loaded to the divider units when coming out of reset. In one implementation, the values may be stored locally within units 21, 25, and 27, or the values may be stored in other storages and loaded when coming out of reset as desired.

In one embodiment, the clock generation unit 12 may be implemented as a PLL. Accordingly, the Gen unit 23 may include a mixer, phase detector, filters, an oscillator such as a VCO, and the like, while the FBDiv unit 27 may be the feedback divider of the PLL. In addition, the PreDiv unit 21 may be representative of a pre-divider unit that divides down the Ref Clk frequency. The OutDiv unit 25 may implement an output divider that divides down the output of the VCO to produce the Output Clk. The Output Clk signal frequency ($F_o$) is a function of the input frequency ($F_i$) of Ref Clk as follows:

$$F_o = \frac{F_i}{PreDiv} * \frac{FBDiv}{OutDiv} \qquad (1)$$

In the illustrated embodiment, the frequency detection unit 14 includes a reference counter unit 16A that is coupled to a comparison unit 18 and to the Ref Clk signal. Similarly, the frequency detection unit 14 includes an output counter unit 16B that is coupled to the comparison unit 18 and to the Output Clk signal.

In one embodiment, the frequency detection unit 14 may be configured to determine whether the clock generation unit 12 is providing the correct Output Clk frequency. More particularly, the frequency detection unit 14 may be configured to return a result that is indicative of whether the frequency of the Output Clk is a predetermined frequency in response to receiving a start signal.

In one embodiment, the clock generation unit 12 and the frequency detection unit 14 may be part of a system on a chip (SOC) implementation. The SOC may include built-in self-test (BIST) circuitry (not shown) that may be initiated during a special test mode, or during each power-on reset of the IC 10, or both as desired. In such an implementation, the BIST circuit may provide the start signal to the frequency detection unit 14. As described in greater detail below, in response to the start signal, the frequency detection unit 14 may be configured to check the frequency of the Output Clk signal and to provide the result signal back to the BIST circuit. In one embodiment, the result signal may be a single bit indication, in which one logic value may correspond to a passing indication and the complimentary logic value may mean a failing indication. In another embodiment, the result indication may be a multi-bit encoding in which the different encodings may correspond to different frequencies above and/or below the predetermined frequency.

In another embodiment, the result information may be provided to a test interface such as an interface that is compliant with the IEEE 1149.1 specification, for example, that may be accessed during a test mode, or other operational mode via a test platform such as automated test equipment (ATE). In yet another embodiment the result information may be provided to an external test platform via the use of scan chains.

As described further below, the reference counter 16A may be configured to count the number of clock edges of the Ref Clk signal and provide that count value when enabled, while the output counter 16B may be configured to count the number of clock edges of the Output Clk signal and provide that count value when enabled. The comparison unit 18 may be configured to compare the count values while taking into account the divider values used in the clock generation circuit 12 to determine if the Output Clk frequency is at the correct frequency.

Figure 2:
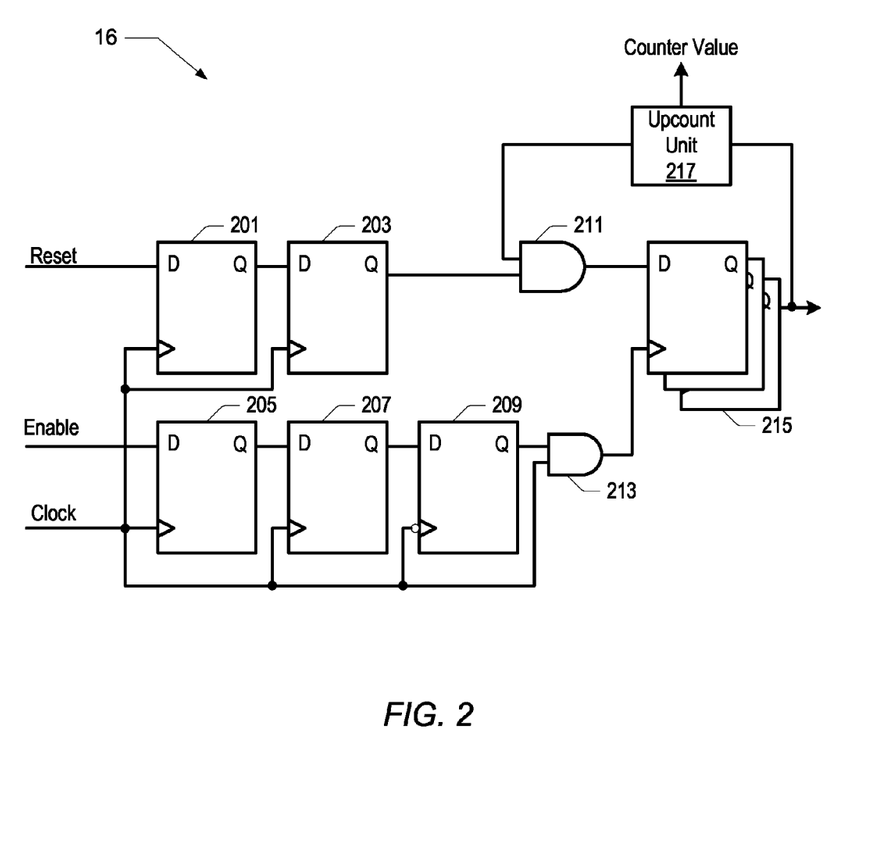
FIG. 2 is a block diagram of one embodiment of a counter unit of FIG. 1.

Referring to FIG. 2, a block diagram of one embodiment of a counter unit of FIG. 1 is shown. The counter 16 includes a number of flip-flops (FF) designated 201, 203, 205, 207, 209, and a bank of FFs designated 215, a pair of AND-gates (211 and 213), and an upcounter unit 217. The input of the FF 201 is coupled to receive a Reset signal. The output of the FF 201 is coupled to the input of the FF 203, the output of which is coupled to one input of AND-gate 211. The output of the AND-gate 211 is coupled to the input of the FF 215. The output of the FF 215 is coupled to one side of the upcounter unit 217. The output of the upcounter unit 217 is coupled to the other input of the AND-gate 211. The FF 201 and FF 203 are clocked by the Clock signal. The input of the FF 205 is coupled to receive the Enable signal. The output of the FF 205 is coupled to the input of the FF 207, the output of which is coupled to the input of FF 209. The output of the FF 209 is coupled to one input of the AND-gate 213, while the output of the AND-gate 213 is coupled to the clock input of the FF 215. Each of the FF 205, and 207 is clocked by the Clock signal. However, FF 209 is clocked by the negative edge of the Clock signal. The Clock signal is coupled to the other input of the AND-gate 213.

The reference counter 16A and output counter 16B of FIG. 1 may be implemented using counter unit 16 of FIG. 2. Accordingly, when used as the reference counter 16A, the Clock signal shown in FIG. 2 is the Ref Clk shown in FIG. 1. Similarly, when used as the output counter 16B, the Clock signal shown in FIG. 2 is the Output Clk shown in FIG. 1. The Enable and Reset signals for the counter must be synchronized into the clock domain being counted. Accordingly, The FF 201 and FF 203 synchronize the Reset signal with the clock domain of the Clock signal. The FF 205, and FF 207 similarly synchronize the Enable signal. Since the Enable signal provides clock gating for the Clock signal, FF 209 is negative edge triggered. This causes it to switch when the Clock signal is low, thereby ensuring that no glitches propagate to the counter.

Since the synchronizer delays are not entirely predictable, there may be some uncertainty. Furthermore, if the Ref Clk and the Output Clk have very different frequencies, the counter unit 16 on the faster clock will start counting sooner than the one on the slower clock, since the synchronization delay is a function of the clock frequency. To minimize the differences in synchronization delay, the counter unit 16 is enabled, and then subsequently disabled prior to reading the counter value. As such, the synchronizer delays essentially cancel out because although the counter on the faster clock starts sooner, it also stops sooner.

Accordingly, in one embodiment when the counter unit 16 is not in operation, the Reset signal and the Enable signal may be held to a logic value of zero. When the counter unit 16 is used, the Reset signal may be de-asserted (allowed to be at logic value of one). Approximately two cycles of the Clock signal after the Reset is de-asserted, a logic value of one will appear at the input of the FF 215. Approximately three cycles of the Clock signal after assertion of the Enable signal, the Clock signal will cause the FF 215 to capture a count. As each edge of the Clock signal clocks the bank of FF 215, the upcounter unit 217 increments. Approximately three cycles of the Clock signal after the Enable signal is de-asserted, the counter unit 16 will stop incrementing. The counter value may then be read or used depending on the implementation.

Figure 3:
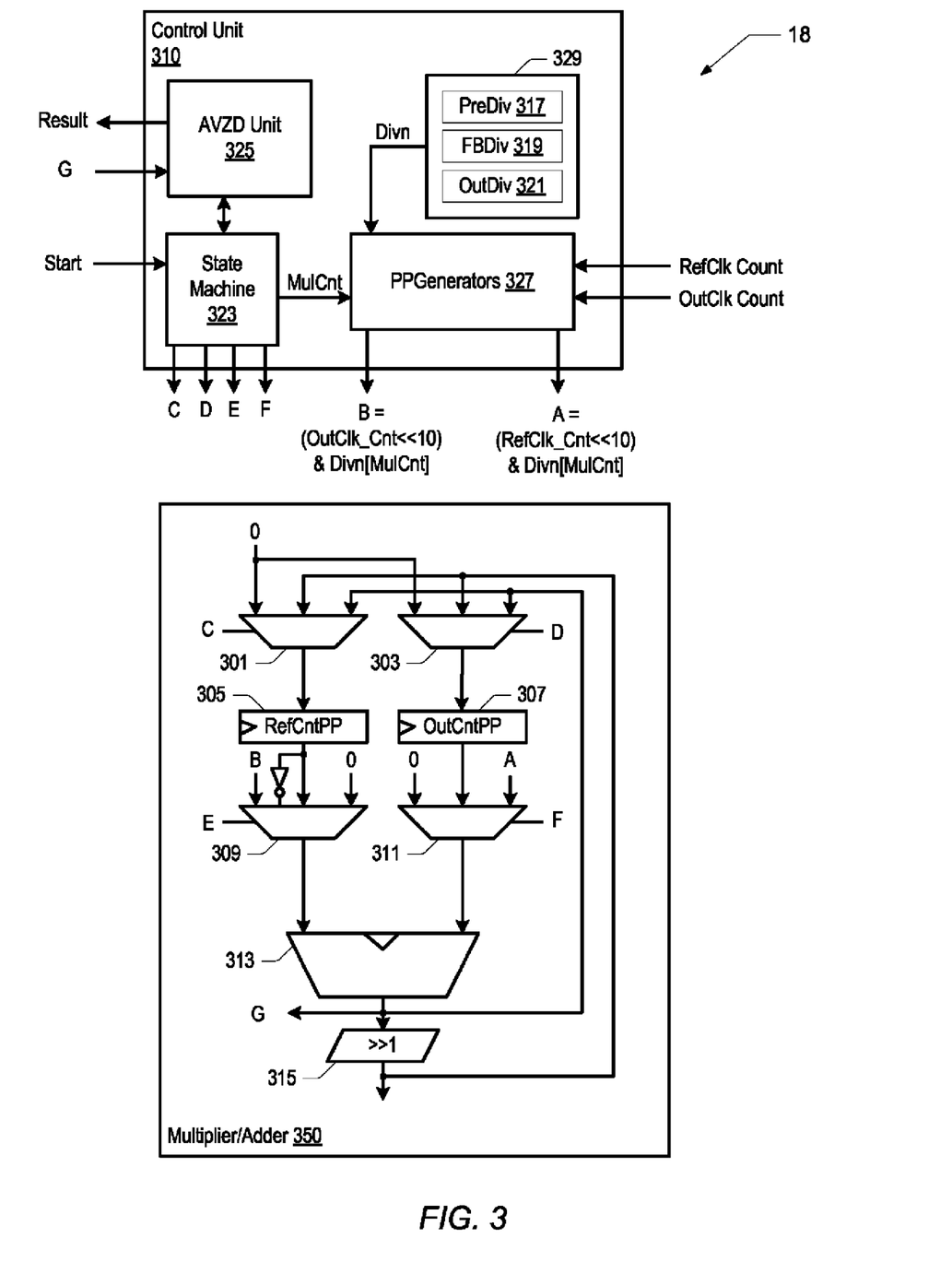
FIG. 3 is a block diagram depicting more detailed aspects of one embodiment of the comparison unit shown in FIG. 1.

Turning to FIG. 3, a block diagram depicting more detailed aspects of one embodiment of the comparison unit of FIG. 1 is shown. The comparison unit 18 includes a control unit 310 coupled to a multiplier/adder (MA) unit 350. The control unit 310 includes a state machine 323, an Absolute value and zero detection (AVZD) unit 325, a partial product (PP) generators unit 327, and a divider value unit 329, which includes storages 317, 319, and 321 for holding PreDiv, FBDiv, and OutDiv divider values, respectively. In one embodiment, the divider values stored within the storages 317, 319, and 321 may be the same values used by the divider units of clock generation unit 12. As shown, the MA unit 350 includes multiplexers (mux) 301, 303, 309, and 311, partial product registers 305 and 307, an adder 313, and a logical shift right shift unit 315.

In one embodiment, the control unit 310 controls the operation of the MA unit 350 by providing control signals for the muxes and partial product values for the adder 313 to operate on. Upon receiving an asserted start signal, the state machine 323 begins cycling through each state (shown in FIG. 4) and providing the mux control signals C-F to determine whether the Output Clk is at a predetermined frequency. More particularly, the comparison unit 18 may be configured to perform operations to satisfy the equation shown in Equation 2, which is a reordering of the terms in Equation 1. It is noted that Equation 1 is reordered since it is easier to implement a multiplier/adder than a divider.

$$F_o * \text{PreDiv} * \text{OutDiv} = F_i \text{FBDiv} \qquad (2)$$

It is noted that in Equation 2, $F_o$ refers the Output Clk frequency and the $F_i$ refers to the Ref Clk frequency. However, the operations performed to satisfy Equation 2 are performed on the counter values, that are proportional to those frequencies. Accordingly, as described further below, in one embodiment upon receiving a start signal and counter values from the Reference counter 16A and the Output counter 16B, the control unit 310 is configured to iteratively perform the three multiplications shown in Equation 2, as well as a subtraction, absolute value, masking operation, and a zero comparison.

In one embodiment, the PP generators 327 may operate independently on each received clock count value, and for each one provide partial products to the MA unit 350 for sequential additions of the partial products. More particularly, as shown in the outputs of signals A and B, the PP generators 327 may be configured to left shift each clock count value 10 bits, and then logically AND one bit of the divider value at a time with the shifted clock count value. For example, the first multiplication involves Ref Clk and FBDiv. This multiplication involves generating nine partial products and then adding the nine partial products together. In the embodiment shown in FIG. 3, the MA unit 350 performs the additions serially. Thus, to create each partial product the Ref Clk count value may be shifted left 10 bits and AND-ed with each bit of the FBDiv value, one bit at a time. Thus on the first iteration, the first partial product is created when FBDiv [0] is logically AND-ed with Ref Clk Count value. This continues for nine iterations, using a different bit of the FBDiv value. For each iteration the partial product is provided as input A or B to muxes 311 and 309, respectively and MA unit 350 adds the previous partial product to the partial product at the input A or B.

During operation, the muxes control the flow of data to allow an iterative multiply/add to be performed, for nine iterations per multiplication operation. For example, when there are no operations being performed, the muxes may be controlled to select the zero inputs. During the first multiplication involving the Ref Clk count and the FBDiv value, as each partial product is provided to input A of mux 311, it is input to one side of the adder 313. The result of the addition is right shifted one bit by shifter 315 and is routed to RefCntPP register 305 to be accumulated. The result in the RefCntPP register 305 is provided as the other input to the adder 313. This operation continues for nine iterations. When all partial products have been added, the result is stored in the RefCntPP register 305. Operation is similar for each of the three multiplications.

After the last iteration of the third multiplication operation, the registers 305 and 307 will contain the values corresponding to each side of Equation 2. Accordingly, the value in the RefCntPP 305 is subtracted from the value in the OutClkPP 307 register using the inverted input of mux 309. At the completion of the subtraction operation, the non-right shifted output 'G' of the adder 313 is provided to back to the AVZD unit 325.

In one embodiment, the AVZD unit 325 may be configured to perform an Absolute Value (ABS) operation on the result of the subtraction. In one embodiment, if the sign bit of the result of the subtraction operation is a one (i.e. negative number), the AVZD unit 325 routes the result back to the MA unit 350 to invert the result and add one to obtain the twos complement value. The non-shifted result is sent back to the AVZD unit 325. The result of the ABS operation may then be checked to see if it is zero. However, due to variances in synchronization of the counters, one or more of the low-order bits of the subtraction result may be masked off prior to the zero check. More particularly in one embodiment, the masking operation may include performing a bitwise AND operation between a mask value and the result of the ABS operation. The mask value may include a one's in the most significant bits and zero's in some number of least significant bits. In one embodiment, the number of zero's in the mask value may be programmable.

In one embodiment, the zero detection operation may include performing an OR-ing operation on the masked result. For example, the result may be logically OR-ed together. If the result is zero, then the Output Clk frequency is operating at the predetermined frequency, and if the result is non-zero the Output Clk frequency is not operating at the predetermined frequency. In one embodiment, the AVZD unit 325 may provide a single bit as a result that may indicate whether the result was zero or non-zero. However, it is contemplated that in other embodiments a multi-bit result value may be provided as mentioned above. For example, in one such embodiment, the entire output of the ABS operation may be used. In another such embodiment, the magnitude of the mismatch may be found to the nearest power of two by performing a find-first-set function from the MSB of the output and then encoding the result.

Figure 4:
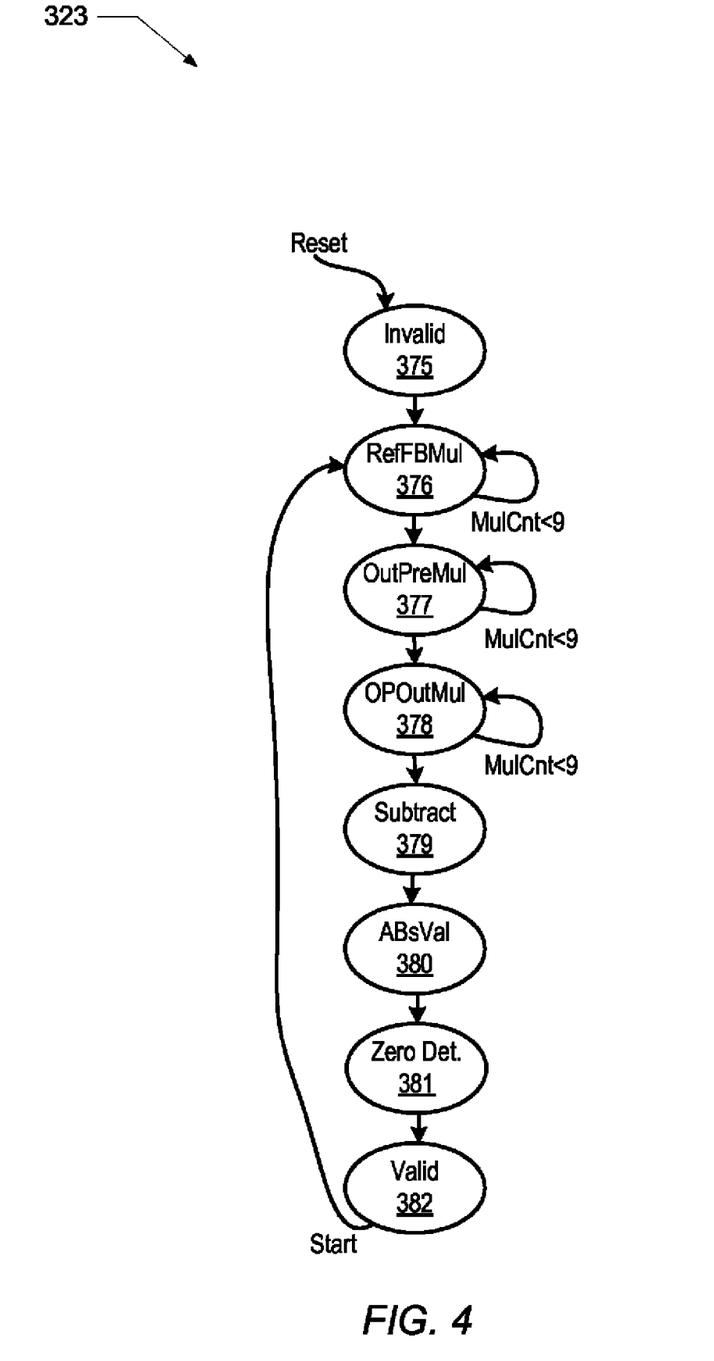
FIG. 4 is a state diagram illustrating one embodiment of the state machine shown in FIG. 3.

Referring to FIG. 4, a state diagram illustrating the states of one embodiment of the state machine of FIG. 3 is shown. In one embodiment, in each state, the state machine 323 provides control signals to the control unit 310 and MA unit 350. The state machine 323 begins in an invalid state 375, in which the result of any comparison is invalid. This may be the state coming out of reset. Upon receiving a start signal, the state machine 323 enters the next state 376, to perform the multiplication of the Ref Clk Count by the FBDiv value shown in Equation 2 and described above. As shown in FIG. 3, the MA unit 350 is a one-bit per cycle multiplier/adder. In addition, in one implementation, the divider values are nine-bit values. Accordingly, the state machine 323 stays in each multiply state (e.g., 376, 377, and 378) for nine iterations. In other embodiments that use other divider values, the multiplication states would iterate for a different number of times.

Once state 376 is complete, the state machine 323 transitions to the next state 377 for nine cycles to allow the MA unit 350 to perform a multiplication of the Output Clk Count by the PreDiv value shown in Equation 2. Once this state is complete, the state machine 323 transitions to the next state 378 for nine cycles to allow the MA unit 350 to perform a multiplication of the result of state 377 by the OutDiv value shown in Equation 2. Once the multiplications are complete, the state machine 323 enters state 379 to allow the MA unit 350 to perform a subtraction of the values on each side of Equation 2. When the subtraction is complete, the state machine 323 enters state 380 where it provides control signals to allow the AVZD unit 325 to perform the ABS operation on the result of the subtraction. When the ABS operation is complete the state machine 323 enters state 381 where it provides signals to allow the AVZD unit 325 to perform masking and a zero detection operation and to provide a final result. The state machine 323 then moves to the valid state 382. In this state, the result is valid and may be provided to external or BIST circuits.

It is noted that in one embodiment the adder 313 may be a ripple carry adder, although any type of adder may be used. It is also noted that in the illustrated embodiments, a one bit per cycle multiply add operation is used. However, although several cycles may be necessary for a result to be provided, such a simple design utilizes less area on the die than some other adder designs. Accordingly, it is contemplated that in other embodiments, other types of adders, and thus a different type of unit may be employed as the MA unit 350. Accordingly, if a different type of MA unit 35 were used the state machine 323 would likewise be different.

Figure 5:
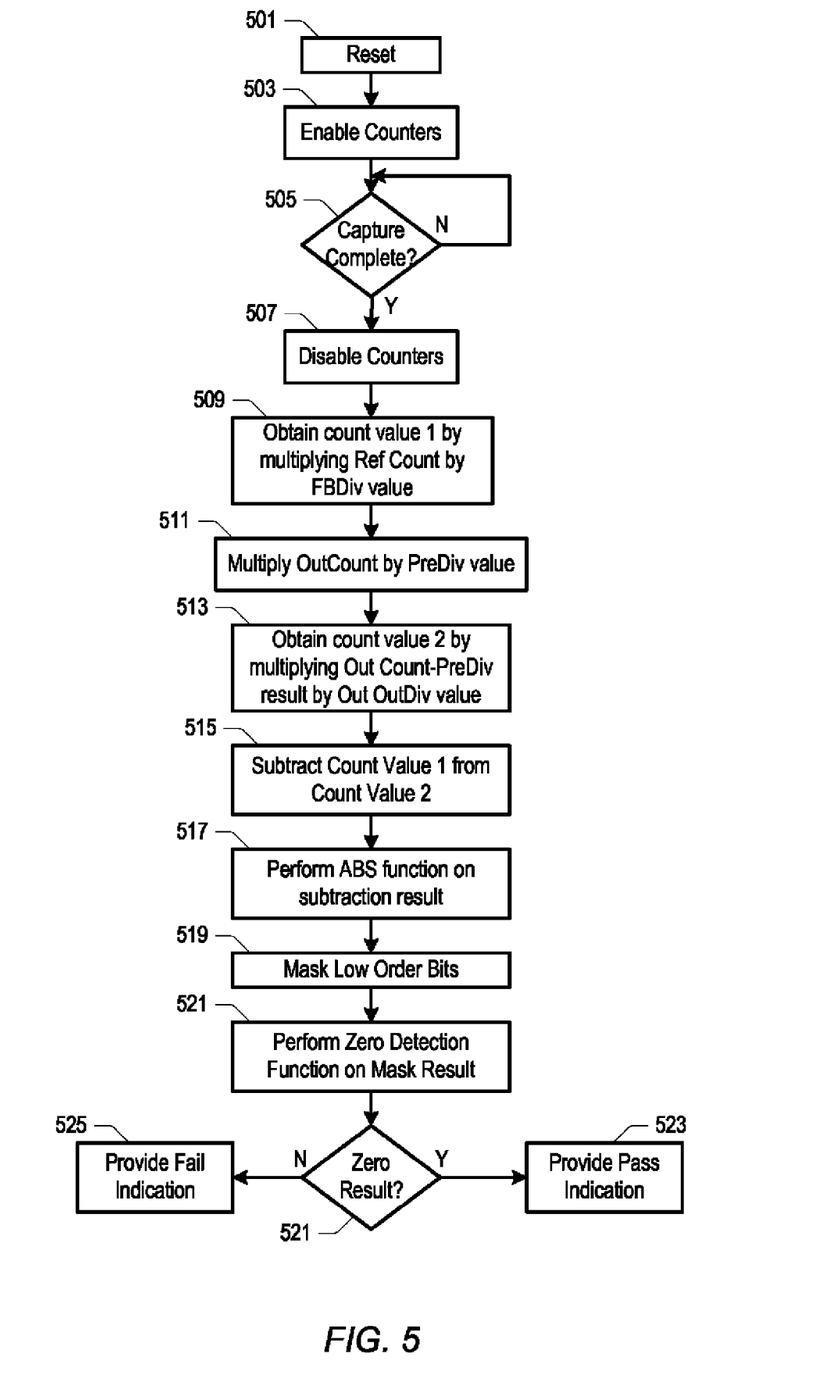
FIG. 5 is a flow diagram describing the operation of the embodiments shown in FIG. 1 through FIG. 4.

FIG. 5 is a flow diagram describing the operation of the embodiments shown in FIG. 1 through FIG. 4. Referring to collectively now to FIG. 1 through FIG. 5, and beginning in block 501 of FIG. 5, the comparison unit 18 may be held in reset when not in use. In one embodiment when a frequency check is enabled, the counter units 16 receive an asserted Enable signal and the Reset signal is de-asserted (i.e., a logic value of one) (block 503). The counters 16 begin counting clock edges as each of the Ref Clk and Output Clk signals clocks the respective counter 16A and 16B. The counters 16 are allowed to run until the capture is complete (block 505). After some predetermined length of time, the counters may be disabled (block 507).

The control unit 310 reads the counter values to perform the multiplications described above. More particularly in one embodiment, the control unit 310 and the MA unit 350 perform the multiplication of the Ref Clk count and the FBDiv value to obtain a first value as described above in conjunction with the description of FIG. 3 and FIG. 4 (block 509). The control unit 310 and the MA unit 350 also perform a multiplication of the Output Clk count and the PreDiv value to obtain an intermediate value as described above in conjunction with the descriptions of FIG. 3 and FIG. 4 (block 511). The control unit 310 and the MA unit 350 then perform the multiplication of the intermediate value and the OutDiv value to obtain a second value as described above in conjunction with the descriptions of FIG. 3 and FIG. 4 (block 513). The first and second values represent the two sides of Equation 2. Accordingly, the control unit 310 and the MA unit 350 perform a subtraction as described above (block 515).

The AVZD unit 325 performs an ABS operation, on the subtraction result (block 380). In one embodiment, the result may be a 32-bit value, and there may be some inaccuracies due to synchronization differences between counters. Thus, to minimize those differences, some number of low-order bits of the subtraction result may be masked off and discarded (block 519). In one embodiment, the AVZD unit 325 determines if the result of the subtraction was zero by performing zero detection operation. In one embodiment, the AVZD unit 325 may logically OR the bits of the result (or the masked result) together to detect zero (block 521). If the result of the OR operation is zero, then the result of the subtraction was zero. As mentioned above, a zero result is indicative that the Output Clk is operating at the predetermined frequency and the test may be deemed as passing. As such, the control unit 310 may provide the passing result value to other parts of the IC 10 (block 523). In contrast, if the result of the OR operation is non-zero, then the result of the subtraction was non-zero. Thus, the Output Clk is not operating at the predetermined frequency and the test may be deemed as failing. As such, the control unit 310 may provide the failing result value to other parts of the IC 10 (block 525).

It is noted that in one embodiment, the raw result of the subtraction may be used by additional logic in the control unit 310 (not shown) to determine not just passing and failing, but also how far away from the predetermined frequency the Output Clk is operating. Accordingly, in such an embodiment, the result may be more than a single bit value.

It is also noted that in other embodiments, some of the operations depicted in the embodiment of FIG. 5 may be omitted and/or performed in a different order to have similar operational results.

Figure 6:
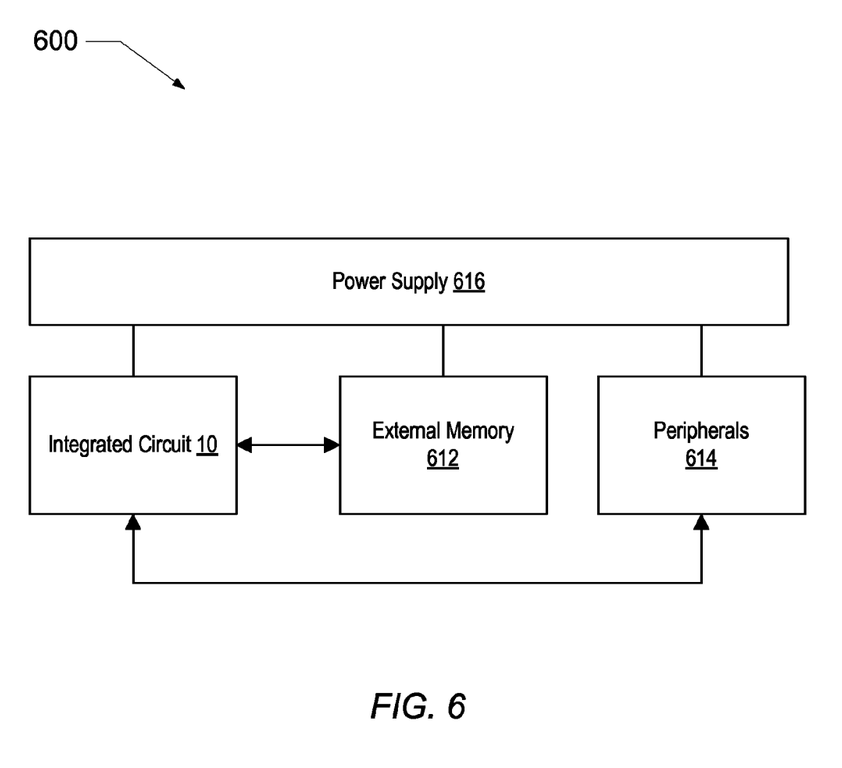
FIG. 6 is a block diagram of one embodiment of a system including the integrated circuit of FIG. 1.

Turning to FIG. 6, a block diagram of one embodiment of a system 500 including the integrated circuit 10 is shown. The system 600 includes at least one instance of the integrated circuit 10 of FIG. 1 coupled to one or more peripherals 614 and an external memory 612. The system 600 also includes a power supply 616 that may provide one or more supply voltages to the integrated circuit 10 as well as one or more supply voltages to the memory 612 and/or the peripherals 614. In some embodiments, more than one instance of the integrated circuit 10 may be included.

The external memory 612 may be any desired memory. For example, the memory may include dynamic random access memory (DRAM), static RAM (SRAM), flash memory, or combinations thereof. The DRAM may include synchronous DRAM (SDRAM), double data rate (DDR) SDRAM, DDR2 SDRAM, DDR3 SDRAM, etc.

The peripherals 614 may include any desired circuitry, depending on the type of system 600. For example, in one embodiment, the system 600 may be a mobile device and the peripherals 614 may include devices for various types of wireless communication, such as WiFi, Bluetooth, cellular, global position system, etc. The peripherals 614 may also include additional storage, including RAM storage, solid-state storage, or disk storage. The peripherals 614 may include user interface devices such as a display screen, including touch display screens or multi-touch display screens, keyboard or other keys, microphones, speakers, etc.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. An integrated circuit comprising:
   a clock generation unit configured to generate an output clock signal at a predetermined frequency that corresponds to a frequency multiple of a reference clock signal provided as an input to the clock generation unit;
   a detection unit coupled to the clock generation unit and configured to determine whether the output clock signal is at the predetermined frequency;
   wherein the detection unit includes:
      a first counter configured to generate a first count value based upon the reference clock signal; and
      a second counter configured to generate a second count value based upon the output clock signal;
      comparison logic configured to perform a plurality of multiplication operations on the first and second count values and to generate a final result that indicates whether the output clock signal is at the predetermined frequency.

2. The integrated circuit as recited in claim 1, wherein the comparison logic is further configured to perform a first multiplication between a first multiplier and the first count value to generate a first intermediate result, perform a second multiplication between a second multiplier and the second count value to generate a second intermediate result, and perform a third multiplication between a third multiplier and the second intermediate result to generate a third intermediate result.

3. The integrated circuit as recited in claim 2, wherein the comparison logic is further configured to perform a subtraction operation between the third intermediate result and the first intermediate result to generate a fourth intermediate result.

4. The integrated circuit as recited in claim 3, wherein the comparison logic is further configured to perform an absolute value operation of the fourth intermediate result to generate a fifth intermediate result.

5. The integrated circuit as recited in claim 4, wherein the comparison logic is further configured to compare the fifth intermediate result to zero to generate the final result.

6. The integrated circuit as recited in claim 1, wherein the comparison logic comprises a one bit per cycle multiplier/adder configured to iteratively perform the plurality of multiplication operations.

7. The integrated circuit as recited in claim 1, wherein the final result comprises a one-bit result which corresponds to a pass/fail result.

8. A method comprising:
   a clock generation unit generating an output clock signal at a predetermined frequency that corresponds to a frequency multiple of a reference clock signal provided as an input to the clock generation unit;
   generating a first count value corresponding to the reference clock signal;
   generating a second count value corresponding to the output clock signal;
   performing a plurality of multiplication operations on the first and second count values and generating a final result that indicates whether the output clock signal is at the predetermined frequency.

9. The method as recited in claim 8, further comprising generating the first count value by enabling a first counter for a predetermined period of time, and subsequently disabling the first counter prior to using the first count value.

10. The method as recited in claim 8, further comprising performing a first multiplication operation between a first multiplier and the first count value to generate a first intermediate result, performing a second multiplication operation between a second multiplier and the second count value to generate a second intermediate result, and performing a third multiplication operation between a third multiplier and the second intermediate result to generate a third intermediate result.

11. The method as recited in claim 10, wherein each of the first multiplier, the second multiplier, and the third multiplier corresponds to a respective divider value, used by an associated respective divider unit within the clock generation unit.

12. The method as recited in claim 10, further comprising performing a subtraction operation between the third intermediate result and the first intermediate result to generate a fourth intermediate result.

13. The method as recited in claim 10, further comprising determining whether the output clock signal is at the predetermined frequency by determining whether the fourth intermediate result is substantially equal to zero.

14. A system comprising:
   an automated test equipment (ATE) platform;
   an integrated circuit coupled to the ATE platform, wherein the integrated circuit includes:
      a clock generation unit configured to generate an output clock signal at a predetermined frequency that corresponds to a frequency multiple of a reference clock signal provided as an input to the clock generation unit;
      a detection unit coupled to the clock generation unit and configured to determine whether the output clock signal is at the predetermined frequency in response to receiving a start signal from the ATE platform;
      wherein the detection unit includes:
         a first counter configured to generate a first count value based upon the reference clock signal; and
         a second counter configured to generate a second count value based upon the output clock signal;
         comparison logic configured to perform a plurality of multiplication operations on the first and second count values to generate a final result that indicates whether the output clock signal is at the predetermined frequency, and to provide the final result to the ATE platform.

15. An integrated circuit comprising:
   a clock generation unit configured to generate an output clock signal at a predetermined frequency that corresponds to a frequency multiple of a reference clock signal provided as an input to the clock generation unit;
   a built-in self-test (BIST) unit;
   a detection unit coupled to the clock generation unit and to the BIST unit and configured to determine whether the output clock signal is at the predetermined frequency in response to receiving a start signal from the BIST unit;
   wherein the detection unit includes:
      a first counter configured to generate a first count value based upon the reference clock signal; and
      a second counter configured to generate a second count value based upon the output clock signal;
      comparison logic configured to perform a plurality of multiplication operations on the first and second count values to generate a final result that indicates whether the output clock signal is at the predetermined frequency, and to provide the final result to the BIST unit.

16. An integrated circuit comprising:

a clock generation unit configured to generate an output clock signal at a predetermined frequency that corresponds to a frequency multiple of a reference clock signal provided as an input to the clock generation unit;

a detection unit coupled to the clock generation unit and configured to:

iteratively perform a first multiplication operation between a first multiplier and a first count value that is based upon the reference clock signal to generate a first intermediate result;

iteratively perform a second multiplication operation between a second multiplier and a second count value that is based upon the output clock signal to generate a second intermediate result;

iteratively perform a third multiplication operation between a third multiplier and the second intermediate result to generate a third intermediate result;

perform a subtraction operation between the third intermediate result and the first intermediate result to determine whether the output clock signal is at the predetermined frequency; and provide a final result as an output that indicates whether the output clock signal is at the predetermined frequency.

17. The integrated circuit as recited in claim 16, wherein the clock generation unit includes a first divider unit, a second divider unit and a third divider unit, each associated with a respective divider value having a particular number of bits.

18. The integrated circuit as recited in claim 17, wherein the detection unit is further configured to perform each of the iterative multiplication operations a number of times specified by the particular number of bits.

19. The integrated circuit as recited in claim 17, wherein each of the first multiplier, the second multiplier, and the third multiplier comprises the respective divider value.

20. The integrated circuit as recited in claim 17, wherein the detection unit is further configured to perform a masking operation on a predetermined number of low-order bit of a result of the subtraction operation.

* * * * *